(12) United States Patent
Chua et al.

(10) Patent No.: US 8,429,326 B2
(45) Date of Patent: Apr. 23, 2013

(54) METHOD AND SYSTEM FOR NAND-FLASH IDENTIFICATION WITHOUT READING DEVICE ID TABLE

(75) Inventors: Huey-Tyug Chua, Hsin-Chu Hsien (TW); Yann-Chang Lin, Hsin-Chu (TW); Ching-Lin Hsu, Tai-Chung Hsien (TW)

(73) Assignee: MediaTek Inc., Science-Based Industrial Park, Hsin-Chu Hsien (TW)

( * ) Notice: Subject to any disclaimer, the term of this patent is extended or adjusted under 35 U.S.C. 154(b) by 1867 days.

(21) Appl. No.: 11/162,465

(22) Filed: Sep. 12, 2005

(65) Prior Publication Data

US 2007/0061498 A1    Mar. 15, 2007

(51) Int. Cl.
*G06F 12/00* (2006.01)

(52) U.S. Cl.
USPC ............................... 711/2; 711/101; 711/212

(58) Field of Classification Search ............ 711/2, 101, 711/212
See application file for complete search history.

(56) References Cited

U.S. PATENT DOCUMENTS

| | | | | |
|---|---|---|---|---|
| 5,511,180 | A * | 4/1996 | Schieve | 711/172 |
| 5,581,708 | A | 12/1996 | Iijima | |
| 5,594,882 | A * | 1/1997 | Bell | 711/212 |
| 5,777,925 | A | 7/1998 | Tokushige | |
| 6,175,523 | B1 | 1/2001 | Yang | |
| 6,646,917 | B1 | 11/2003 | Yoshimura | |
| 6,704,852 | B2 | 3/2004 | Lai | |
| 7,290,185 | B2 * | 10/2007 | Kirscht | 714/704 |
| 2003/0024976 | A1 | 2/2003 | Komurasaki | |
| 2003/0172261 | A1 * | 9/2003 | Lee et al. | 713/1 |
| 2004/0017708 | A1 | 1/2004 | Choi et al. | |
| 2004/0042280 | A1 | 3/2004 | Nagashima et al. | |
| 2004/0076069 | A1 | 4/2004 | Voth et al. | |
| 2004/0088474 | A1 | 5/2004 | Lin | |
| 2005/0005059 | A1 | 1/2005 | Tanaka et al. | |
| 2005/0138271 | A1 * | 6/2005 | Bernstein et al. | 711/103 |
| 2005/0180206 | A1 | 8/2005 | Randell | |
| 2005/0207232 | A1 * | 9/2005 | Delfs et al. | 365/185.33 |
| 2006/0195650 | A1 * | 8/2006 | Su et al. | 711/103 |

FOREIGN PATENT DOCUMENTS

| | | |
|---|---|---|
| DE | 102 34 139 A1 | 2/2003 |
| TW | 484064 | 4/2002 |
| TW | I221217 | 9/2004 |
| WO | 02/075745 A1 | 9/2002 |

OTHER PUBLICATIONS

IEEE 100, The Authoritative Dictionary of IEEE Standards Terms, Seventh Edition, 2000, p. 31.*

* cited by examiner

*Primary Examiner* — Jared Rutz
*Assistant Examiner* — Gurtej Bansal
(74) *Attorney, Agent, or Firm* — Winston Hsu; Scott Margo

(57) ABSTRACT

A method and system for identifying a NAND-Flash without reading a device ID. The method includes: executing an identification flow for setting a first page of a block as a target block, utilizing a combinations table to query a target block, evaluating a result by comparing a identifying information in the target block with the combinations table, trying all combinations in the combinations table until correctly identifying the NAND-Flash by having a positive match result or returning an error if none of the combinations match.

27 Claims, 7 Drawing Sheets

| Priority | Interface bits | Address bytes |
|---|---|---|
| 1 | 16 | 3 |
| 2 | 8 | 3 |
| 3 | 16 | 4 |
| 4 | 8 | 4 |
| 5 | 16 | 5 |
| 6 | 8 | 5 |

Fig. 4

| Priority | Interface bits | Page size | Address bytes |
|----------|----------------|-----------|---------------|
| 1 | 16 | 512 | 3 |
| 2 | 8 | 512 | 3 |
| 3 | 16 | 512 | 4 |
| 4 | 8 | 512 | 4 |
| 5 | 16 | 2048 | 4 |
| 6 | 8 | 2048 | 4 |
| 7 | 16 | 2048 | 5 |
| 8 | 8 | 2048 | 5 |

Fig. 5

METHOD AND SYSTEM FOR NAND-FLASH IDENTIFICATION WITHOUT READING DEVICE ID TABLE

BACKGROUND

The present invention relates to NAND-Flash identification, and more particularly, to a method and system capable of identifying NAND-Flash without requiring the reading of the NAND-Flash device ID.

Two primary technologies have dominated the non-volatile flash memory market place. These two technologies are called NOR-Flash memory and NAND-Flash memory. NOR-Flash memory was first introduced around 1988. At that time, NOR-Flash revolutionized its market. In prior years, the market had been dominated by EPROM and EEPROM solutions. NOR-Flash typically enables higher read performance than NAND-Flash. As a result, NOR-Flash has usually been utilized for such applications as code storage and execution. NOR-Flash is often utilized in consumer electronic devices such as: low-end cell phones, embedded applications, and simple consumer electronic products.

The NAND-Flash memory architecture was introduced by Toshiba in 1989. NAND-Flash memory is suitable for many forms of file storage. It is currently utilized in some of the most popular consumer electronic devices. In the consumer electronics market place NAND-Flash is utilized by MP3 players, USB flash drives, digital camera memory cards, and many other devices. NAND-Flash memory was designed for high capacity, low cost, and fast responsive performance. Additionally, NAND-Flash offers many other benefits. NAND-Flash is typically less expensive than NOR flash, NAND-Flash has very high cell densities, NAND-Flash is available in many much larger capacities, NAND-Flash is capable of faster write and erase performance than NOR-Flash. As a result, it has been an obvious choice to utilize NAND-Flash memory for data storage applications in the consumer electronic devices mentioned above.

The NAND-Flash architecture is not accessed in the same manner as other general memory devices. NAND-Flash reading requires that the system knows the exact configuration of the NAND-Flash. Utilizing the exact NAND-Flash configuration information is imperative for data reading and writing. Generally, the NAND-Flash architecture is organized as a memory array having a plurality of blocks. For example, what is referred to as a small sized NAND-Flash may be described as a device having a capacity equaling 8 MB, 16 MB, 32 MB, or 64 MB, while what is referred to as a large sized NAND-Flash may be described as a device having a capacity equaling 128 MB, 256 MB, 512 MB, or 1 GB. As to the small sized NAND-Flash, each block is consisted of 16 pages, and each page is divided into a data area having 512 bytes and a spare area having 16 bytes. As to the large sized NAND-Flash, each block is consisted of 64 pages, and each page is divided into a data area having 2048 bytes and a spare area having 64 bytes. Since the configuration of the small sized NAND-Flash is different from that of the large sized NAND-Flash, parameters applied to accessing data stored in a page vary from NAND-Flash to NAND-Flash. That is, if a system is unable to correctly recognize its installed NAND-Flash, data accessing of the NAND-Flash is sure to fail.

It is well known that a system that utilizes NAND-Flash must maintain a static device ID table to access the NAND-Flash. The device ID table is utilized for easily identifying the type of NAND-Flash. The device ID table of pre-defined data typically contains information such as: a total size, a total block size, a page size, I/O interface bits, address bytes, and a type of ECC (e.g., 1 bit or 4 bits). The table is required since reading and writing to and from NAND-Flash, as mentioned above, requires knowing the exact NAND-Flash configuration.

Conventional systems that utilize NAND-Flash identify the exact type of NAND-Flash utilizing the static device ID table. Unfortunately, this conventional method of NAND-Flash identification may not be the most effective solution. A first deficiency with the conventional NAND-Flash identification method is that for devices to utilize new NAND-Flash as new vendors and existing vendors release new sizes and new specifications of NAND-Flash, the conventional system requires that the static device ID table be maintained current with the industry's NAND-Flash products. Ensuring that the device ID table is up-to-date requires a non-trivial maintenance effort. A second deficiency with the conventional NAND-Flash identification method becomes obvious as more vendors release new NAND-Flash products. This forces the static device ID table that contains the NAND-Flash ID list to continually grow. This static device ID table must grow larger because the identification information about new NAND-Flash is continually added to the static device ID table. The growing static device ID table requires larger and larger memory capacities. As a result, it becomes necessary to utilize larger storage devices to store the static device ID table. The conventional method is to store the static device ID table in the BOOT code or on-chip ROM code. Storing the static device ID table in BOOT code or on-chip ROM code is already a costly configuration. This problem is further compounded because the static device ID table continues growing larger.

In view of the foregoing problems of identifying NAND-Flash it can be appreciated by one skilled in the art that a substantial need exists for a new and efficient method and apparatus that is capable of identifying a type of NAND-Flash and doing so without needing to read or access a conventional static NAND-Flash device ID table.

SUMMARY

It is therefore one of the objectives of the present invention to provide a low cost alternative for identifying a type of NAND-Flash without the need to read or otherwise access a static NAND-Flash device ID table, to solve the above problems.

According to an exemplary embodiment of the present invention, a method for NAND-Flash identification is disclosed. The method comprises: writing a predetermined pattern into a page of a NAND-Flash; utilizing at least a test attribute to read contents stored in the NAND-Flash for outputting a result; checking if the result matches the predetermined pattern and the test attribute; and if the result matches the predetermined pattern and the test attribute, utilizing the test attribute to identify the NAND-flash and to set an actual attribute utilized for accessing data stored in the NAND-Flash.

According to another exemplary embodiment of the present invention, a method for NAND-Flash identification is disclosed. The method comprises: filling a page of a NAND-Flash with NAND-Flash identification information; reading at least a data segment beyond a test page boundary; checking if the data segment includes the NAND-Flash identification information; and if the data segment includes the NAND-Flash identification information, determining a page size of the NAND-Flash according to the test page boundary.

According to another exemplary embodiment of the present invention, a method for NAND-Flash identification is disclosed. The method comprises: filling a page of a NAND-Flash with NAND-Flash identification information including a predetermined pattern; utilizing a plurality of test attributes including settings of I/O interface bits and address bytes to read contents stored in the NAND-Flash for outputting a result and to read at least a data segment beyond a test page boundary; checking if the result matches the predetermined pattern and the test attributes, and the data segment includes the NAND-Flash identification information; and if the result matches the predetermined pattern and the test attributes, and the data segment includes the NAND-Flash identification information, determining a page size of the NAND-Flash according to the test page boundary, and utilizing the test attributes and the page size to identify the NAND-flash and to set a plurality of actual attributes utilized for accessing data stored in the NAND-Flash.

According to another exemplary embodiment of the present invention, a system capable of performing NAND-Flash identification is disclosed. The system comprises: a NAND-Flash having a predetermined pattern stored in a page of the NAND-Flash; and a controller coupled to the NAND-Flash, the controller comprising: an accessing unit for utilizing at least a test attribute to read contents stored in the NAND-Flash and output a result accordingly; and a checking unit coupled to the accessing unit for checking if the result matches the predetermined pattern and the test attribute, wherein if the result matches the predetermined pattern and the test attribute, the checking units utilizes the test attribute to identify the NAND-flash and to set an actual attribute utilized by the accessing unit for accessing data stored in the NAND-Flash.

According to another exemplary embodiment of the present invention, a system capable of performing NAND-Flash identification is disclosed. The system comprises: a NAND-Flash having a page filled with NAND-Flash identification information; and a controller coupled to the NAND-Flash, the controller comprising: an accessing unit for reading at least a data segment beyond a test page boundary; a checking unit coupled to the accessing unit for checking if the data segment includes the NAND-Flash identification information, wherein if the data segment includes the NAND-Flash identification information, the checking unit determines a page size of the NAND-Flash according to the test page boundary.

According to another exemplary embodiment of the present invention, a system capable of performing NAND-Flash identification is disclosed. The system comprises: a NAND-Flash having a page filled with NAND-Flash identification information including a predetermined pattern; a controller coupled to the NAND-Flash, the controller comprising: an accessing unit for utilizing a plurality of test attributes including settings of I/O interface bits and address bytes to read contents stored in the NAND-Flash for outputting a result and to read at least a data segment beyond a test page boundary; and a checking unit coupled to the accessing unit for checking if the result matches the predetermined pattern and the test attributes, and the data segment includes the NAND-Flash identification information, wherein if the checking unit finds that the result matches the predetermined pattern and the test attributes, and the data segment includes the NAND-Flash identification information, the checking unit determines a page size of the NAND-Flash according to the test page boundary, and utilizes the test attributes and the page size to identify the NAND-flash and to set a plurality of actual attributes utilized by the accessing unit for accessing data stored in the NAND-Flash.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 is a first table illustrating the retry combinations utilized by the accessing unit shown in FIG. 1 according to the present invention.

FIG. 5 is a second table illustrating the retry combinations utilized by the accessing unit shown in FIG. 1 according to the present invention.

DETAILED DESCRIPTION

Please note that the present invention is capable of NAND-Flash detection given NAND-Flash utilized for booting or NAND-Flash utilized for data storage. The examples shown below are provided to illustrate the various embodiments of the present invention and are not limitations.

Figure 1:
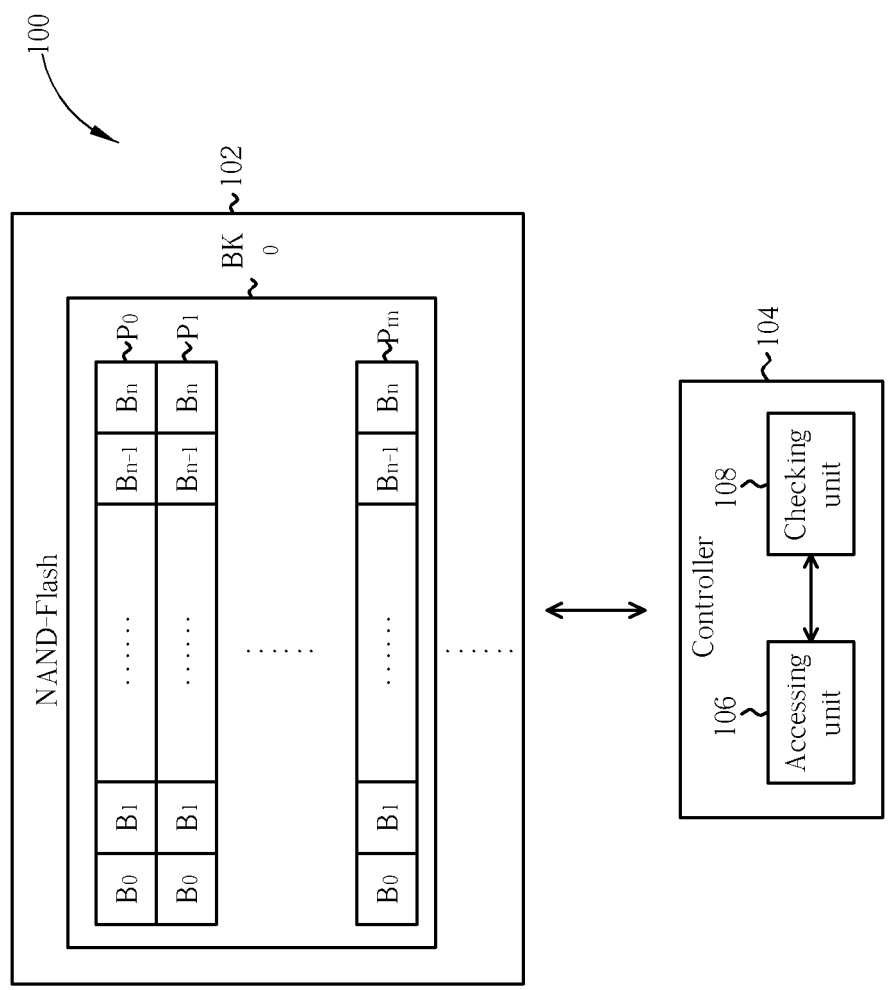
FIG. 1 is a diagram illustrating a system capable of performing NAND-Flash identification according to the present invention.

Please refer to FIG. 1. FIG. 1 is a diagram illustrating a system 100 capable of performing NAND-Flash identification according to the present invention. The system 100 includes a NAND-Flash 102 and a controller 104 coupled to the NAND-Flash 102. In this embodiment, the controller 102 has an accessing unit 106 for accessing data stored in the NAND-Flash 102 and a checking unit 108 for checking the accessing result to identify the configuration of the NAND-Flash 102. As known to those skilled in this art, the NAND-Flash 102 includes a plurality of blocks each having a plurality of pages. For simplicity, only one block $BK_0$ is shown in FIG. 1. The block $BK_0$ has a plurality of pages $P_0$-$P_m$ each containing a plurality of bytes $B_0$-$B_n$. The operation of identifying the configuration of the NAND-Flash 102 is detailed as follows.

Figure 2:
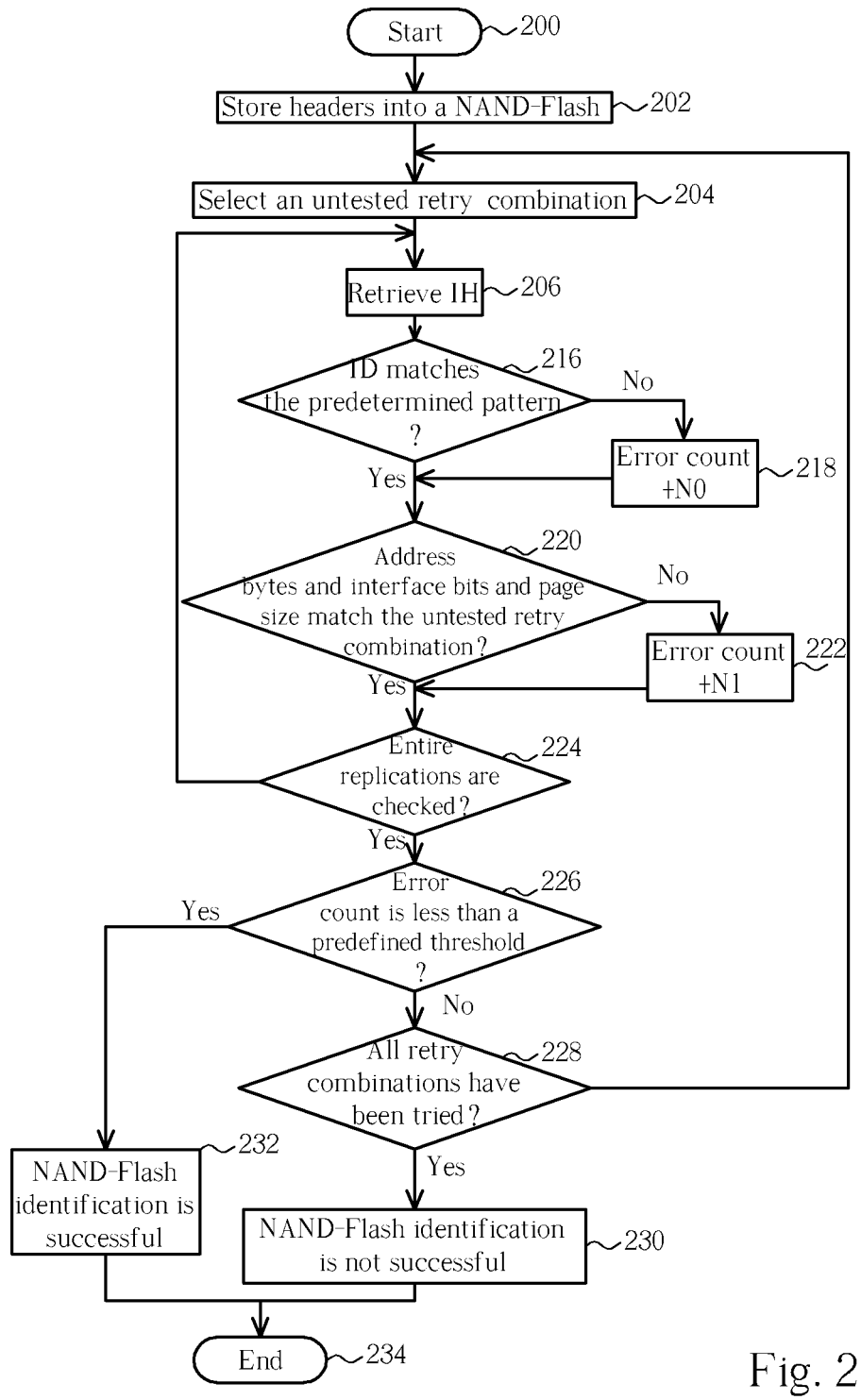
FIG. 2 is a flowchart illustrating the method for NAND-Flash detection without reading an ID table according to a first embodiment of the present invention.

Please refer to FIG. 2. FIG. 2 is a flowchart illustrating the method for NAND-Flash detection without reading an ID table according to a first embodiment of the present invention. The operation of the first embodiment has the following steps:

Step 200: Start.

Step 202: Store Identification Headers (IHs) each having a predetermined pattern ID into a page of a NAND-Flash.

Step 204: Select an untested retry combination from the available retry combinations and utilize the NAND-Flash access information provided by the selected retry combination to read the contents of the page of the NAND-Flash.

Step 206: Retrieve one pre-stored IH.

Step 216: Check if the ID recorded in the retrieved IH matches the predetermined pattern, if no, go to Step 218; otherwise, go to Step 220.

Step 218: Increment an error count by a weighting N0.

Step 220: Further look into the retrieved IH to check if its address bytes, interface bits and page sizes match the selected untested retry combination; if no, go to Step 222; otherwise go to Step 224.

Step 222: Increment the error count by a weighting N1.

Step 224: Check if the entire replications of headers have been exercised through; if no, go ahead to next IH and repeat Step 206; otherwise go to Step 226.

Step 226: Check if the error count is under the predefined threshold; if yes, go to Step 232; otherwise go to Step 228.

Step 228: Are all of the retry combinations tried? If yes, go to step 210; otherwise, go to step 204.

Step 230: NAND-Flash identification detection is not successful. Go to step 214.

Step 232: NAND-Flash identification detection is successful.

Step 234: End.

An illustrative example is listed as follows to further illustrate the method of NAND-Flash identification without reading an ID table according to the first embodiment. The NAND-Flash identification requires headers each having a predetermined pattern written into the NAND-Flash 102 (step 202). For example, during the manufacturing process, the headers are pre-recorded into the NAND-Flash 102 such that the system 100 has the NAND-Flash 102 installed therein can perform the following steps to identify the NAND-Flash 102. Please refer to FIG. 3, which is a diagram illustrating NAND-Flash identification information stored in the NAND-Flash 102. In this embodiment, the headers are filled in the first page (page $P_0$) of the first block (block $BK_0$). Assume that the NAND-Flash 102 is a small sized NAND-Flash having a data area of 512 bytes $B_0$-$B_{511}$, and each header $IH_1, \ldots, IH_{16}$ has 32 bytes containing NAND-Flash identification information. Please note that each header $IH_1, \ldots, IH_{16}$ filled in page $P_0$ contains the same NAND-Flash identification information having a predetermined pattern ID encoded in an ASCII code, e.g., "IDENTITY".

Then, the accessing unit 106 of the controller 104 select an untested retry combination from available retry combinations and utilizes the NAND-Flash access information provided by the retry combination to read the contents, the predetermined pattern ID, of page $P_0$. Please refer to FIG. 4, which is a first table illustrating the retry combinations utilized by the accessing unit 106 shown in FIG. 1 according to the present invention. Each retry combination includes two test attributes, interface bits and address bytes, where the interface bits define the bits transferred per cycle between the NAND-Flash 102 and the controller 104, and the address bytes define the bytes used for carrying the column address and the row address. In this first embodiment, the page size information has been pre-recorded in the header $IH_1$, and the page size information can be correctly obtained after the interface bits and the address bytes for the NAND-Flash 102 are identified. The accessing unit 106 utilizes the NAND-Flash test attributes to access the NAND-Flash 102. For example, the accessing unit 106 can access and perform a read operation on the first page $P_0$ of the first block $BK_0$ to generate a result, for example, the result can be the contents of the read operation. Therefore, from the page contents, the accessing unit 106 retrieves an identification header (IH) containing a predetermined pattern ID (Step 206). According to the test priority defined in the table shown in FIG. 4, the accessing unit 106 starts accessing the predetermined pattern ID in header $IH_1$ utilizing interface bits of 16 and address bytes of 3. After contents are retrieved from the NAND-Flash 102, the checking unit 108 starts checking if the retrieved contents have valid predetermined pattern ID (step 216), and then checking if the interface bits, page sizes and address bytes match the retry combination adopted by the accessing unit 106 (step 220). That is, the checking unit 108 checks if the ASCII code "IDENTITY" has been correctly retrieved. The checking operation is exercised until the entire header replications pre-recorded in the NAND-Flash are checked (step 224). An error count is provided to evaluate the accuracy of the result of the checking operation. As shown in FIG. 2, if the ID doesn't match the predetermined pattern, the checking unit 108 will increment the error count by N0 (Step 218). If the attributes don't match the untested retry combination, the checking unit 108 will increment the error count by N1 (Step 222). Moreover, in the step 226, the checking unit 108 may determine if the result of the checking operation is acceptable by further checking whether the final error count is under a predetermined threshold. If the retrieved contents include the valid predetermined pattern ID (step 216), the interface bits, page sizes and address bytes match the combination referenced by the accessing unit 106 (step 220), and step 226 is evaluated to be true, the checking unit 108 regards the retrieved contents and the predetermined pattern ID match (i.e., are the same as one another), and then utilizes the test attributes to set the actual attributes utilized by the accessing unit 106 for accessing data stored in the NAND-Flash 102 (step 232). Alternatively, if the retrieved contents include no valid predetermined pattern ID, the checking unit 108 notifies the accessing unit 106. The accessing unit 106 selects another retry combination from available untested retry combinations listed in the table shown in FIG. 4, and then utilizes the selected retry combination to retrieve the predetermined pattern ID again (step 204). Please note, if all of the retry combinations shown in FIG. 3 have been tested and no valid predetermined pattern ID is found, the NAND-Flash identification fails (step 230). For example, the header pre-recorded in the NAND-Flash 102 has an erroneous data format not supported by the controller 104, or the NAND-Flash 102 itself has internal defects causing the pre-recorded header to have the incorrect predetermined pattern ID.

As described above, before the retrieved contents match the predetermined pattern ID included in the pre-recorded header $IH_1$, the retry combinations are sequentially adopted by the accessing unit 106 to test the configuration of the NAND-Flash 102. Therefore, without reading any ID table, the method for NAND-Flash identification of the present invention is capable of identifying wanted attributes used for accessing the NAND-Flash 102. It should be noted that any number of NAND-Flash attributes can be utilized as test attributes. These test attributes can be utilized in any combination. The specific test attribute examples shown above are for illustrative purposes only and do not reflect a limitation of the present invention.

Please refer to FIG. 5, which is a second table illustrating the retry combinations utilized by the accessing unit 106 shown in FIG. 1 according to the present invention. Each retry combination includes three test attributes, interface bits, page size and address bytes, where the interface bits define the bits transferred per cycle between the NAND-Flash 102 and the controller 104, the page size defines the number of bytes per block, and the address bytes define the bytes used for carrying the column address and the row address. Conventionally, as to a small size NAND-Flash, the page size is 512 bytes; as to a large size NAND-Flash, the page size is 2048 bytes. In another embodiment of the present invention, the page size information is not pre-recorded in the header $IH_1$. Therefore, the attribute, page size, is required to be identified in conjunction with other attributes, interface bits and address bytes.

Figure 6A:
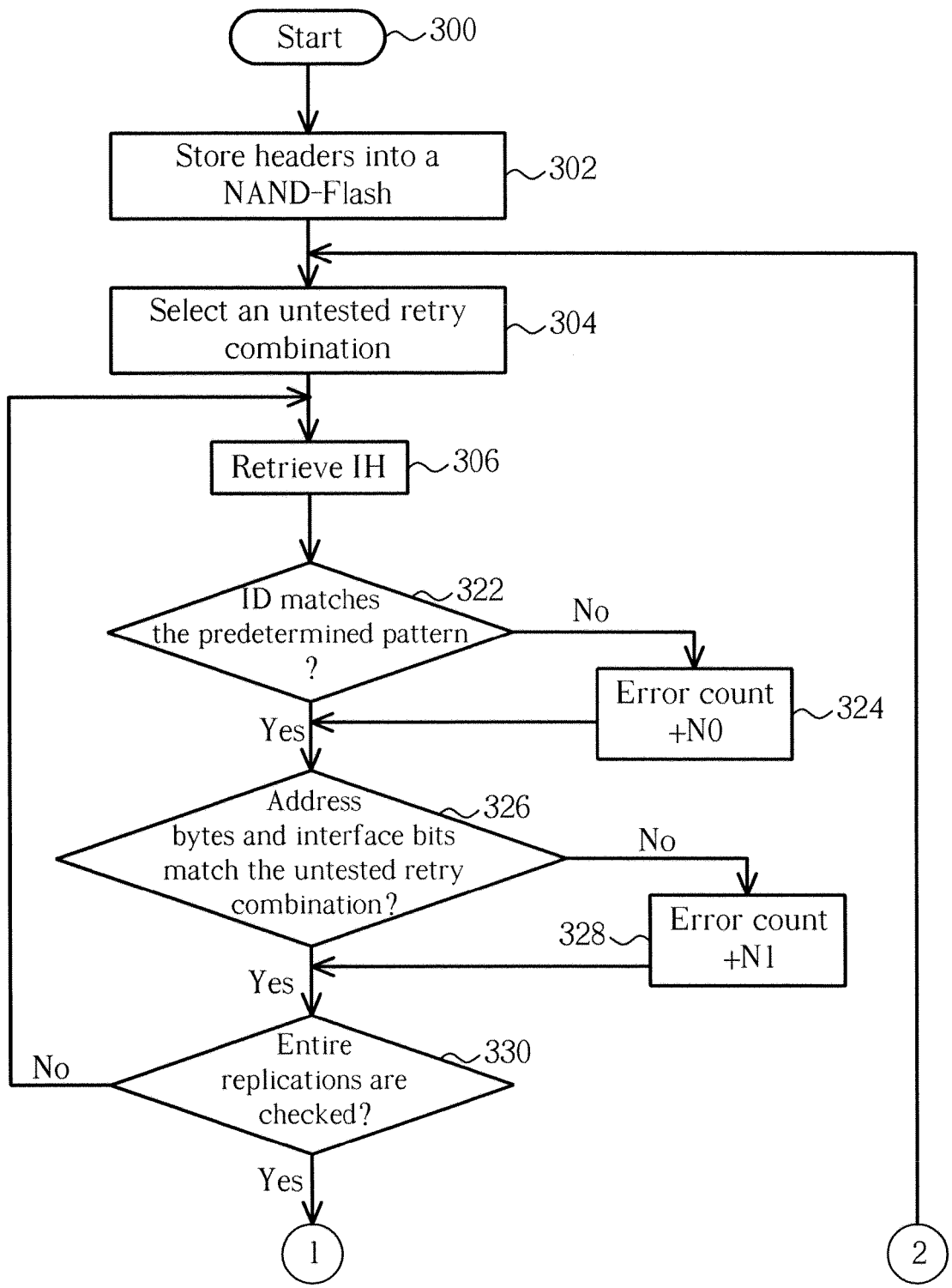
FIG. 6a and FIG. 6b is a flowchart illustrating the method for NAND-Flash detection without reading an ID table according to a second embodiment of the present invention.
Figure 6B:
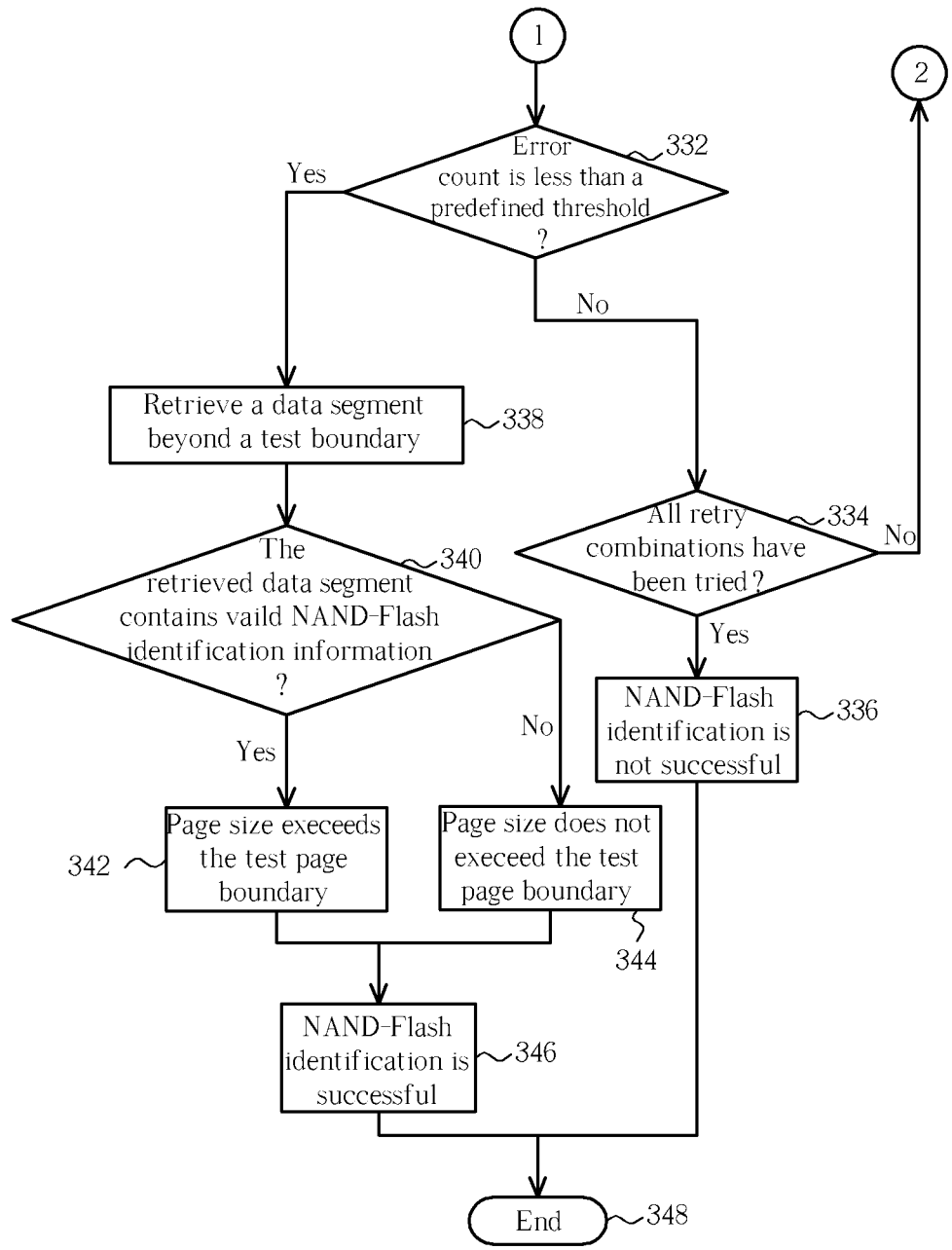

Please refer to FIG. 6a and FIG. 6b. FIG. 6a and FIG. 6b is a flowchart illustrating the method for NAND-Flash detection without reading an ID table according to a second embodiment of the present invention. The operation of the second embodiment has the following steps:

Step 300: Start.
Step 302: Store Identification Headers (IHs) each having a predetermined pattern ID into a page of a NAND-Flash.
Step 304: Select an untested retry combination from the available retry combinations and utilize the NAND-Flash access information provided by the selected retry combination to read the contents of the page of the NAND-Flash.
Step 306: Retrieve one pre-stored IH.
Step 322: Check if the ID recorded in the retrieved IH matches the predetermined pattern; if no, go to Step 324; otherwise, go to Step 326.
Step 324: Increment an error count by a weighting N0.
Step 326: Further look into the retrieved IH to check if its address bytes and interface bits match the selected untested retry combination; if no, go to Step 328; otherwise go to Step 330.
Step 328: Increment the error count by a weighting N1.
Step 330: Check if the entire replications have been exercised through; if no, go ahead to next IH and repeat Step 306; otherwise go to Step 332.
Step 332: Check if the error count is under the predefined threshold; if yes, go to Step 311; otherwise go to Step 308.
Step 334: Are all of the retry combinations tried? If yes, go to step 310; otherwise, go to step 304.
Step 336: NAND-Flash identification detection is not successful. Go to step 320.
Step 338: Retrieve a data segment beyond a test page boundary.
Step 340: Check if the data segment retrieved beyond the test page boundary contains valid NAND-Flash identification information. If yes, go to step 342; otherwise, go to step 344.
Step 342: Determine the page size exceeding the test page boundary. Go to step 346.
Step 344: Determine the page size not exceeding the test page boundary. Go to step 346.
Step 346: NAND-Flash identification detection is successful.
Step 348: End.

Figure 3:
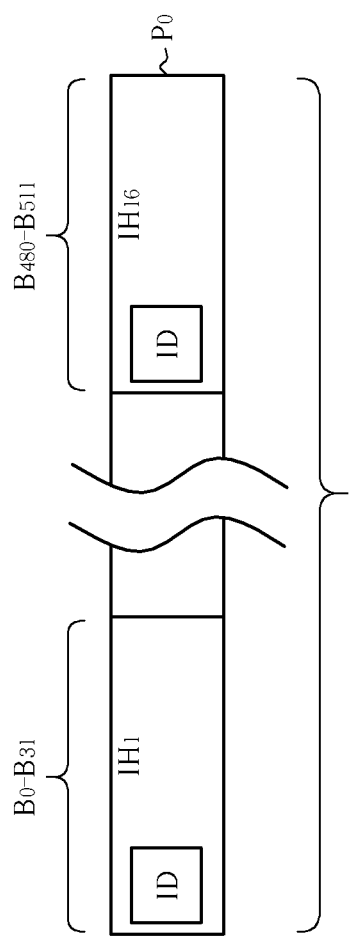
FIG. 3 is a diagram illustrating NAND-Flash identification information stored in the NAND-Flash.

The operation of the second embodiment is predominantly the same as the first embodiment. The two differ in the procedure (steps 338, 340, 342, and 344) of identifying the page size of the NAND-Flash 102. All other operations are identical to the first embodiment and are not described again for brevity. As to page size detection, the accessing unit 106 of the controller 104 firstly retrieves a data segment beyond a test page boundary (step 338). For example, the test page boundary in this embodiment is set as the $512^{th}$ byte $B_{511}$ of the page $P_0$, that is, data not read from these bytes $B_0$-$B_{511}$ at the page $P_0$ is regarded as data retrieved beyond the test page boundary. Based on the test page boundary, the accessing unit 106 in the second embodiment tries to retrieve the $513^{th}$-$544^{th}$ bytes at the page $P_0$ for getting the additional one header stored beyond the test boundary. Please note, at this point, that the controller 104 has no idea about how many bytes at the page $P_0$. Therefore, the checking unit 108 then examines the data segment retrieved from step 338 to check if it includes valid NAND-Flash identification information (step 340). As shown in FIG. 3, the page $P_0$ ends with the $512^{th}$ byte $B_{512}$. It is obvious that the data segment retrieved from non-existing bytes (i.e., the $513^{th}$-$544^{th}$ bytes) at the page $P_0$ includes unknown data. The checking unit 108, therefore, determines that the page size of the NAND-Flash 102 is to have 512 bytes (small size NAND-Flash) instead of 2048 bytes (large size NAND-Flash) (step 344). Then, the NAND-Flash identification is done successfully to know the actual configuration of the NAND-Flash 102 that is a small sized NAND-Flash (step 346).

Taking a large sized NAND-Flash for example, it commonly has a data area with 2048 bytes. As mentioned above, the first page of the first block is filled with a plurality of headers each having identical NAND-Flash identification infomration. Therefore, as step 338 is performed to get a data segment beyond the above-mentioned test boundary from the large sized NAND-Flash, the checking unit 108 is sure to detect a valid header contained in the retrieved data segment. Then, the checking unit 108 determines that the page size of the NAND-Flash 102 is to have 2048 bytes instead of 512 bytes (step 342). Then, the NAND-Flash identification is done successfully to know the actual configuration of the NAND-Flash 102 that is a large sized NAND-Flash (step 346).

It is possible that the NAND-Flash 102 has internal defects that are unable to correctly store data. Therefore, for better page size detection accuracy, the data length of the retrieved data segment beyond the test page boundary may cover more than one header. In other words, the accessing unit 106 in step 338 tries to retrieves N headers beyond the test page boundary. If the checking unit 108 finds that there are M headers included in the data segment have valid NAND-Flash identification information where M is greater than a preset threshold, the checking unit proceeds to step 344 for assigning a small number (e.g., 512-byte) to the page size attribute; otherwise, the checking unit proceeds to step 314 for assigning a greater number (e.g., 2048-byte) to the page size attribute.

In contrast to the related art, the method and system identify a NAND-Flash without the use of the conventional device ID table. The accessing unit utilizes a plurality of NAND-Flash retry combinations to examine the configuration of the NAND-Flash. If NAND-Flash identification fails under a specific retry combination then an untested retry combination is selected. The checking unit will either discover the correct retry combination that allows successful access to and identification of the NAND-Flash or the checking unit will exhaust all available retry combinations thus determining that NAND-Flash identification fails. Due to the obsolescence of the conventional ID table utilized in the NAND-Flash identification, the method and system for NAND-Flash identification eliminate the need for storing and maintaining the large sized ID table in a non-volatile memory, e.g., a read-only memory (ROM) storing the boot code. The claimed NAND-Flash identification scheme is easily implemented, and is capable of lowering the production cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for identifying a configuration type of a NAND-Flash, the method comprising:
(a) storing a header having a predetermined pattern into the NAND-Flash;
(b) utilizing at least a test attribute to read contents in the NAND-Flash for outputting a result, and to read at least a data segment beyond a test page boundary;
(c) checking if the result includes the predetermined pattern; and (d) if the result includes the predetermined pattern, identifying the configuration type of the NAND-Flash according to the utilized test attribute.

2. The method of claim 1, wherein the predetermined pattern is stored into a page of the NAND-Flash and the page is the first page of a block in the NAND-Flash.

3. The method of claim 2, wherein the block is the first block of the NAND-Flash.

4. The method of claim 1, wherein the predetermined pattern is expressed in ASCII code.

5. The method of claim 1, wherein the test attribute includes settings of I/O interface bits and address bytes and the step (c) further checks if the result includes the utilized test attribute; and step (d) further comprises:
if the result includes the predetermined pattern and the utilized test attribute, utilizing the utilized test attribute to set a plurality of actual attributes for accessing data stored in the NAND-Flash.

6. The method of claim 5, wherein a list of available combinations is provided, and step (b) further comprises:
selecting one combination of settings of I/O interface bits and address bytes from the available combinations to set the test attribute.

7. The method of claim 5, further comprising:
counting the number of times when the step (c) determines that the result does not include the predetermined pattern and the test attribute, and then obtaining an error count; and
determining whether the error count is under a predetermined threshold.

8. The method of claim 1, wherein the test attribute includes settings of I/O interface bits, address bytes, and page size and the step (c) further checks if the result includes the utilized test attribute; and the step (d) further comprises:
if the result includes the predetermined pattern and the utilized test attribute, utilizing the utilized test attribute to set a plurality of actual attributes for accessing data stored in the NAND-Flash.

9. The method of claim 8, wherein a list of available combinations is provided, the step (b) further comprises:
selecting one combination of settings of I/O interface bits, address bytes and page size from the available combinations to set the test attribute.

10. The method of claim 1, further comprising:
booting by utilizing the NAND-Flash.

11. A method for identifying a configuration type of a NAND-Flash, the method comprising:
(a) storing a header having a NAND-Flash identification information into the NAND-Flash;
(b) utilizing at least a test attribute to read contents within a test page boundary of the NAND-Flash for outputting a result, and to read at least a data segment beyond the test page boundary;
(c) checking if the result and the data segment include the NAND-Flash identification information; and
(d) if the result includes the NAND-Flash identification information and the data segment does not include the NAND-Flash identification information, determining a page size of the NAND-Flash according to the test page boundary.

12. The method of claim 11, wherein step (b) further comprises: reading N data segments beyond the test page boundary, wherein N is at least one; and
step (c) further comprises:
checking if each of the N data segments includes the NAND-Flash identification information; and step (d) further comprises:
if the number of data segments including the NAND-Flash identification information reaches a predetermined threshold, determining the page size of the NAND-Flash according to the test page boundary.

13. A method for identifying a configuration type of a NAND-Flash, the method comprising:
(a) storing a header having a NAND-Flash identification information into the NAND-Flash, wherein the NAND-Flash identification information includes a predetermined pattern;
(b) utilizing a plurality of test attributes including settings of I/O interface bits and address bytes to read contents in the NAND-Flash for outputting a result and to read at least a data segment beyond a test page boundary;
(c) checking if the result includes the predetermined pattern and the data segment includes the NAND-Flash identification information; and
(d) if the result includes the predetermined pattern and the data segment does not include the NAND-Flash identification information, determining a page size of the NAND-Flash according to the test page boundary, and identifying the configuration type of the NAND-Flash according to the utilized test attribute and the page size.

14. A system capable of identifying a configuration type of a NAND-Flash, the system comprising:
a NAND-Flash having a header with a predetermined pattern; and
a controller coupled to the NAND-Flash, the controller comprising:
an accessing unit for utilizing at least a test attribute to read contents in the NAND-Flash and outputting a result accordingly, and to read at least a data segment beyond a test page boundary; and
a checking unit coupled to the accessing unit for checking if the result includes the predetermined pattern, wherein if the result includes the predetermined pattern, the checking units utilizes the utilized test attribute to identify the configuration type of the NAND-Flash.

15. The system of claim 14, wherein the predetermined pattern is stored into a page of the NAND-Flash and the page is the first page of a block in the NAND-Flash.

16. The system of claim 15, wherein the block is the first block of the NAND-Flash.

17. The system of claim 14, wherein the predetermined pattern is expressed in ASCII code.

18. The system of claim 14, wherein the test attribute includes settings of I/O interface bits and address bytes and the checking unit further checks if the result includes the utilized test attribute, and if the result includes the predetermined pattern—and the utilized test attribute, the checking unit utilizes the utilized test attribute to set a plurality of actual attributes utilized by the accessing unit for accessing data stored in the NAND-Flash.

19. The system of claim 18, wherein a list of available combinations is provided, and the accessing unit further selects one combination of settings of I/O interface bits and address bytes from the available combinations to set the test attribute.

20. The system of claim 18, further comprising:
a count device for counting the number of times when the checking unit determines that the result does not include the predetermined pattern and the test attribute to obtain an error count; and
wherein the checking unit further determines whether the error count is under a predetermined threshold.

21. The system of claim 14, wherein the test attribute includes settings of I/O interface bits, address bytes and page size and the checking unit further checks if the result includes the utilized test attribute, and if the result includes the predetermined pattern and the utilized test attribute, the checking unit utilizes the utilized test attribute to set a plurality of actual attributes utilized by the accessing unit for accessing data stored in the NAND-Flash.

22. The system of claim 21, wherein a list of available combinations is provided, the accessing unit further selects one combination of settings of I/O interface bits, address bytes and page size from the available combinations to set the test attribute.

23. The system of claim 14, wherein the NAND-Flash is specified for booting.

24. The system of claim 14, wherein the NAND-Flash is specified for data storage.

25. A system capable of identifying a configuration type of a NAND-Flash, the system comprising:
 a NAND-Flash having a page filled with NAND-Flash identification information; and
 a controller coupled to the NAND-Flash, the controller comprising:
  an accessing unit for reading contents within a test page boundary of the NAND-flash for outputting a result, and reading at least a data segment beyond the test page boundary;
  a checking unit coupled to the accessing unit for checking if the result and—the data segment include the NAND-Flash identification information, wherein if the result includes the NAND-Flash identification information and the data segment does not include the NAND-Flash identification information, the checking unit determines a page size of the NAND-Flash according to the test page boundary.

26. The system of claim 25, wherein the accessing unit reads N data segments beyond the test page boundary where N is at least one, the checking unit checks if each of the N data segments includes the NAND-Flash identification information, and if the checking unit finds that the number of data segments including the NAND-Flash identification information reaches a predetermined threshold, the checking unit determines the page size of the NAND-Flash according to the test page boundary.

27. A system capable of identifying a configuration type of a NAND-Flash, the system comprising:
 a NAND-Flash having a page filled with NAND-Flash identification information including a predetermined pattern;
 a controller coupled to the NAND-Flash, the controller comprising:
  an accessing unit for utilizing a plurality of test attributes including settings of I/O interface bits and address bytes to read contents in the NAND-Flash for outputting a result and to read at least a data segment beyond a test page boundary; and
  a checking unit coupled to the accessing unit for checking if the result includes the predetermined pattern, and the data segment includes the NAND-Flash identification information, wherein if the checking unit finds that the result includes the predetermined pattern, and the data segment does not include the NAND-Flash identification information, the checking unit determines a page size of the NAND-Flash according to the test page boundary, and identifies the configuration type of the NAND-Flash according to the utilized test attributes and the page size.

* * * * *